United States Patent [19]

Shinsha et al.

[11] Patent Number: 4,882,690

[45] Date of Patent: Nov. 21, 1989

[54] INCREMENTAL LOGIC SYNTHESIS METHOD

[75] Inventors: Takao Shinsha, Yokohama; Masato Morita; Yoshinori Sakataya, both of Hadano; Yoji Tsuchiya, Hiratsuka; Mitsuhiro Hikosaka, Kawasaki; Junji Koshishita, Yokohama, all of Japan; Keiho Akiyama, Madison, Wis.; Takashige Kubo, Hachioji, Japan

[73] Assignees: Hitachi, Ltd.; Hitachi Microcomputer Engineering, Ltd.; Hitachi Software Engineering Co., Ltd., all of Tokyo, Japan

[21] Appl. No.: 911,461

[22] Filed: Sep. 25, 1986

[30] Foreign Application Priority Data

Sep. 26, 1985 [JP] Japan ................................. 60-210920

[51] Int. Cl.⁴ .......................... G06F 15/60; G06F 7/00
[52] U.S. Cl. .................................. 364/490; 364/489; 364/488
[58] Field of Search ................ 364/488, 489, 490, 491, 364/200, 900a

[56] References Cited

U.S. PATENT DOCUMENTS 4,636,966  1/1987  Yamada et al. ...................... 364/491
4,703,435 10/1987  Darringer et al. ................... 364/489

OTHER PUBLICATIONS

"Incremental Logic Synthesis Through Gate Logic Structure Identification", by Shinsha et al., IEEE 23rd Design Automation Conference, 1986, pp. 391–397.
"An Overview of Logic Synthesis Systems", by Louise Trevillyan, 24th ACM/IEEE Design Automation Conference, 1987, pp. 166–172.
Darringer et al., "Experiments in Logic Synthesis", IEEE—ICCC, 1986, pp. 234–237.
Darringer et al., "A New Look at Logic Synthesis", 17th DA Conference 1980, pp. 543–549.
"Methods Used in an Automatic Logic Design Generator (ALERT)" by Friedman et al., IEEE Trans. on Computer, vol. C—18, No. 7, Jul. 1969, pp. 593–614.
"Quality of Designs from an Automatic Logic Generator (ALERT)" by Friedman et al., 7th DA Conference 1970, pp. 71–89.
"Design Automation of Digital Systems" by M. Breuer, Prentice—Hall, 1972, pp. 21–101.
"Logic Design of Digital System" by D. L. Dietmeyer, Allynt Bacon, Boston, 1978, pp. 156–238.
"Logic Synthesis Through Lead Transformations" by Darringer et al., IBM Journal of Research and Development, vol. 25, No. 4, Jul. 1981, pp. 272–280.

Primary Examiner—Parshotam S. Lall
Assistant Examiner—V. N. Trans
Attorney, Agent, or Firm—Antonelli, Terry & Wands

[57] ABSTRACT

A logic design automation system examines correspondence relationship among sublogics in intermediate gate-level logic (containing neither physical design information nor manually optimized logic design information) produced from updated functional-level logic and current gate-level logic (containing the above information) to identify corresponding sublogics and non-corresponding sublogics of the gate-level logics with reference to primary input/output signals and input/output gates. For the corresponding sublogics, the corresponding sublogics of the current gate-level logic are selected, and for the non-corresponding sublogics, the non-corresponding sublogics of the intermediate gate-level logic are selected. The selected sublogics are combined to synthesize updated gate-level logic which preserved therein the physical design information and the manually optimized logic design information for portions of the current gate-level logic which need not be modified.

55 Claims, 16 Drawing Sheets

FIG. 7

| GI\GJ | 301 | 302 | 303 | 304 | 305 | 306 | 307 |
|---|---|---|---|---|---|---|---|
| 401 | $50(\frac{2}{3}+\frac{2}{2})$ = 83 | | | | | | $50(\frac{2}{6}+\frac{2}{2})$ = 67 |
| 402 | 0 | $50(\frac{2}{2}+\frac{2}{3})$ = 83 | | | | | $50(\frac{2}{6}+\frac{2}{3})$ = 50 |
| 403 | | 0 | | | | | |
| 404 | | | | | | | |
| 405 | $50(\frac{2}{3}+\frac{2}{6})$ = 50 | $50(\frac{2}{2}+\frac{2}{6})$ = 67 | | $50(\frac{4}{6}+\frac{4}{6})$ = 67 | $50(\frac{4}{6}+\frac{4}{6})$ = 67 | | $50(\frac{4}{6}+\frac{4}{6})$ = 67 |
| 406 | $50(\frac{2}{3}+\frac{2}{6})$ = 50 | $50(\frac{2}{2}+\frac{2}{6})$ = 67 | | $50(\frac{4}{6}+\frac{4}{6})$ = 67 | $50(\frac{4}{6}+\frac{4}{6})$ = 67 | | $50(\frac{4}{6}+\frac{4}{6})$ = 67 |
| 407 | $50(\frac{2}{3}+\frac{2}{6})$ = 50 | $50(\frac{2}{2}+\frac{2}{6})$ = 67 | | | | | $50(\frac{4}{6}+\frac{4}{6})$ = 67 |

FIG. 8

| TRIPLE NUMBER | $R_{CIS}(G_I, G_J)$ | GI | GJ |
|---|---|---|---|
| 1 | 83 | 301 | 401 |
| 2 | 83 | 302 | 402 |
| 3 | 67 | 302 | 405 |
| 4 | 67 | 302 | 406 |
| 5 | 67 | 302 | 407 |
| 6 | 67 | 304 | 403 |
| 7 | 67 | 304 | 404 |
| 8 | 67 | 305 | 403 |
| 9 | 67 | 305 | 404 |
| 10 | 67 | 307 | 401 |
| 11 | 67 | 307 | 405 |
| 12 | 67 | 307 | 406 |
| 13 | 67 | 307 | 407 |
| 14 | 50 | 301 | 405 |
| 15 | 50 | 301 | 406 |
| 16 | 50 | 301 | 407 |
| 17 | 50 | 307 | 402 |

FIG. 10

| CG$_{KJ}$\CG$_{KI}$ | 307 |
|---|---|
| 405 | 0 |
| 406 | $50(\frac{1}{1}+\frac{1}{1})$ = 100 |
| 407 | 0 |

FIG. 11

| TRIPLE NUMBER | R$_{COG}$(CG$_{KI}$,CG$_{KJ}$) | CG$_{KI}$ | CG$_{KJ}$ |
|---|---|---|---|
| 1 | 100 | 307 | 406 |
| 2 | 0 | 307 | 405 |
| 3 | 0 | 307 | 407 |

FIG. 12

| CG_KJ \ CG_KI | 304 | 305 |
|---|---|---|
| 403 | $50(\frac{1}{2}+\frac{1}{3})$ = 42 | $50(\frac{1}{1}+\frac{1}{3})$ = 67 |
| 404 | $50(\frac{1}{2}+\frac{1}{1})$ = 75 | $50(\frac{1}{1}+\frac{1}{1})$ = 100 |

FIG. 13

| TRIPLE NUMBER | $R_{COG}(CG_{KI}, CG_{KJ})$ | $CG_{KI}$ | $CG_{KJ}$ |
|---|---|---|---|
| 1 | 100 | 305 | 404 |
| 2 | 75 | 304 | 404 |
| 3 | 67 | 305 | 403 |
| 4 | 42 | 304 | 403 |

FIG. 15

| SGJ \ SGI | 304-A | 304-B |
|---|---|---|
| 403-A | 0 | $50(\frac{2}{2}+\frac{2}{2})$ = 100 |
| 403-B | 0 | 0 |

FIG. 16

| TRIPLE NUMBER | $R_{CIG}(SG_I, SG_J)$ | SGI | SGJ |
|---|---|---|---|
| 1 | 100 | 304-B | 403-A |
| 2 | 0 | 304-A | 403-A |
| 3 | 0 | 304-A | 403-B |
| 4 | 0 | 304-B | 403-B |

INCREMENTAL LOGIC SYNTHESIS METHOD

BACKGROUND OF THE INVENTION

1. Field Of The Invention

The present invention relates to a logic design automation system which uses a computer, and more particularly to updating of gate-level logic in the physical design phase.

2. Description Of The Prior Art

As a digital system has recently been implemented in VLSI's, an automatic logic synthesis system has been developed to improve design quality of the digital system and reduce design manpower required, in which gate-level logic which indicates connection of gates is automatically generated by inputting functional-level logic such as Boolean expression, truth table or standard macro logic into a computer. Since the automatic logic synthesis system handles only logic design information which the system generates by itself such as gate information or interconnecting line information, it is useful in an initial transformation from the functional-level logic to the gate-level logic in the logic design phase prior to physical design. Physical design information such as gate position information, gate replacement information and pin exchange information, and manually optimized logic design information are added in the physical design phase. If the functional-level logic is modified in the physical design phase and the gate-level logic is synthesized by the automatic logic synthesis system from the modified functional-level logic, the information for the portions which need not be modified are lost.

In order to resolve the above problem, it is necessary to automatically identify the portions of the current gate-level logic which need not be modified and bring them in the updated gate-level logic. However, such a method has not been available. Methods for automatically verifying logical equivalency between logic functions are disclosed in the following articles but they are not sufficient to resolve the problem. Article 1: "Boolean Comparison of Hardware and Flowcharts" by G. L. Smith et al, IBM J. Res. Develop., Vol. 26, No. 1, January 1982, pages 106 – 116. Article 2: "A Procedure for Functional Design Verification" by S. B. Akers, 10th FTCS, 1980, pages 65 – 67.

SUMMARY OF THE INVENTION

It is the object of the present invention to provide a novel method in a logic design automation system in which physical design information and manually optimized logic design information contained in portions of the current gate-level logic which need not be modified in updating the functional-level logic in the physical design phase are automatically succeeded to the updated gate-level logic.

In accordance with the present invention, in a logic design automation system for automatically synthesizing gate-level logic from functional-level logic, the method comprises the steps of synthesizing intermediate gate-level logic containing neither physical design information nor manually optimized logic design information from the updated functional-level logic when portions of the current functional-level logic corresponding to the current gate-level logic containing the above information are modified, identifying corresponding sublogics and non-corresponding sublogics which are common and not common to the current gate-level logic and the intermediate gate-level logic, respectively, and combining the corresponding sublogics of the current gate-level logic with the non-corresponding sublogics of the intermediate gate-level logic to synthesize updated gate-level logic preserving physical design information and manually optimized logic design information for portions of the current gate-level logic which need not be modified.

BRIEF DESCRIPTION OF THE DRAWINGS

FIGS. 7 to 13 show results of processing of FIG. 6;

FIGS. 15 and 16 show results of processing of FIG. 14;

DESCRIPTION OF THE PREFERRED EMBODIMENTS

Figure 2:
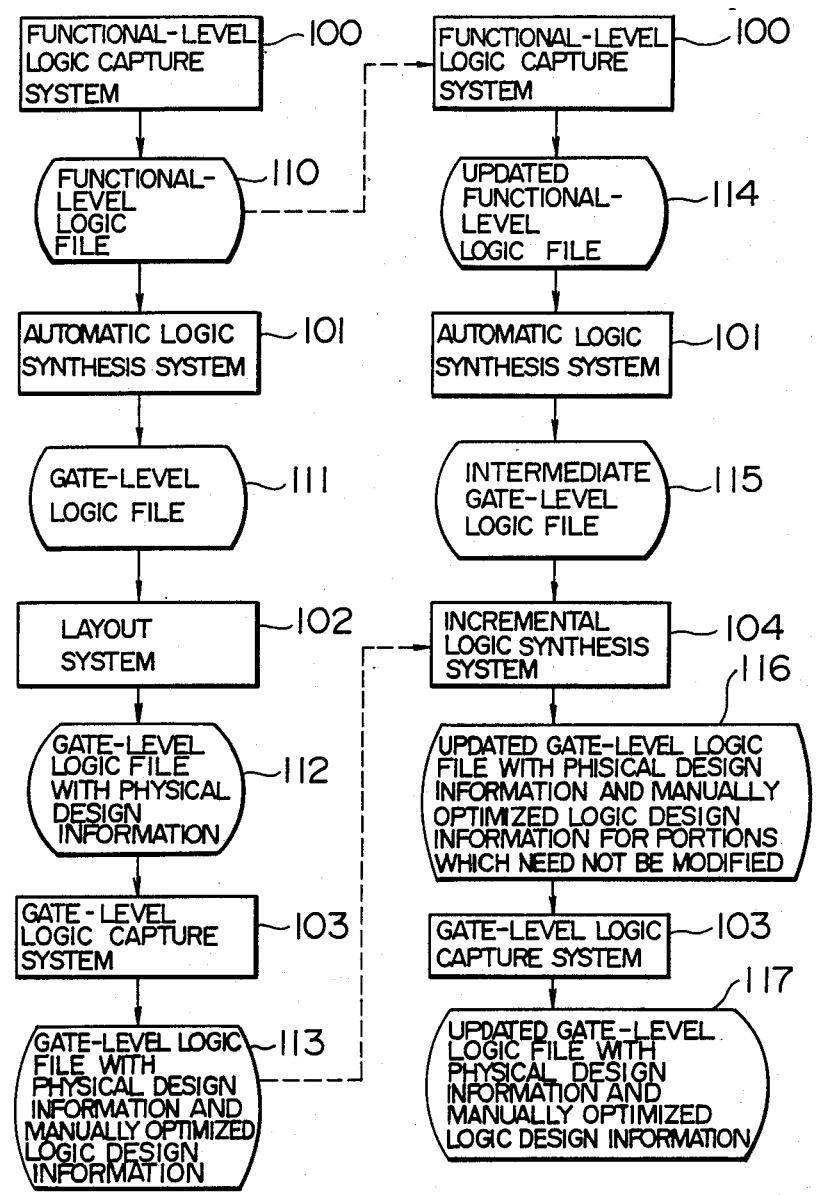
FIG. 2 shows a chart of automatic synthesis and automatic updating of gate-level logic.

Referring to FIG. 2, an environment in which the incremental logic synthesis system of the present invention operates is explained. The left portion of FIG. 2 shows an operation flow chart in an initial logic design phase. After functional-level logic design, a functional-level logic file 110 is created using a functional-level logic capture system 100, a gate-level logic file 111 is generated by an automatic logic synthesis system 101, physical design information is added by a layout system 102 to prepare a gate-level logic file 112 with the physical design information, and the gate-level logic is manually optimized using a gate-level logic capture system 103 as required to prepare a gate-level logic file 113 with the physical design information and the manually optimized logic design information.

The right portion of FIG. 2 shows an operation flow when functional-level logic design changes occur. The functional-level logic file 110 is modified using the functional-level logic capture system 100 to prepare an updated functional level logic file 114, an intermediate gate-level logic file 115 is generated from the file 114 by the automatic logic synthesis system 101, the file 115 and the file 113 are supplied to an incremental logic synthesis system 104 to generate an updated gate-level logic file 116 with the physical design information and the manually optimized logic design information of the portions of the gate-level logic in the file 113 which need not be modified, the physical design information of the added gate-level portions is entered using the gate-level logic capture system 103, and the gate-level logic is manually optimized as required to prepare an updated gate-level logic file 117 with the physical design information and the manually optimized logic design information.

Figure 3:
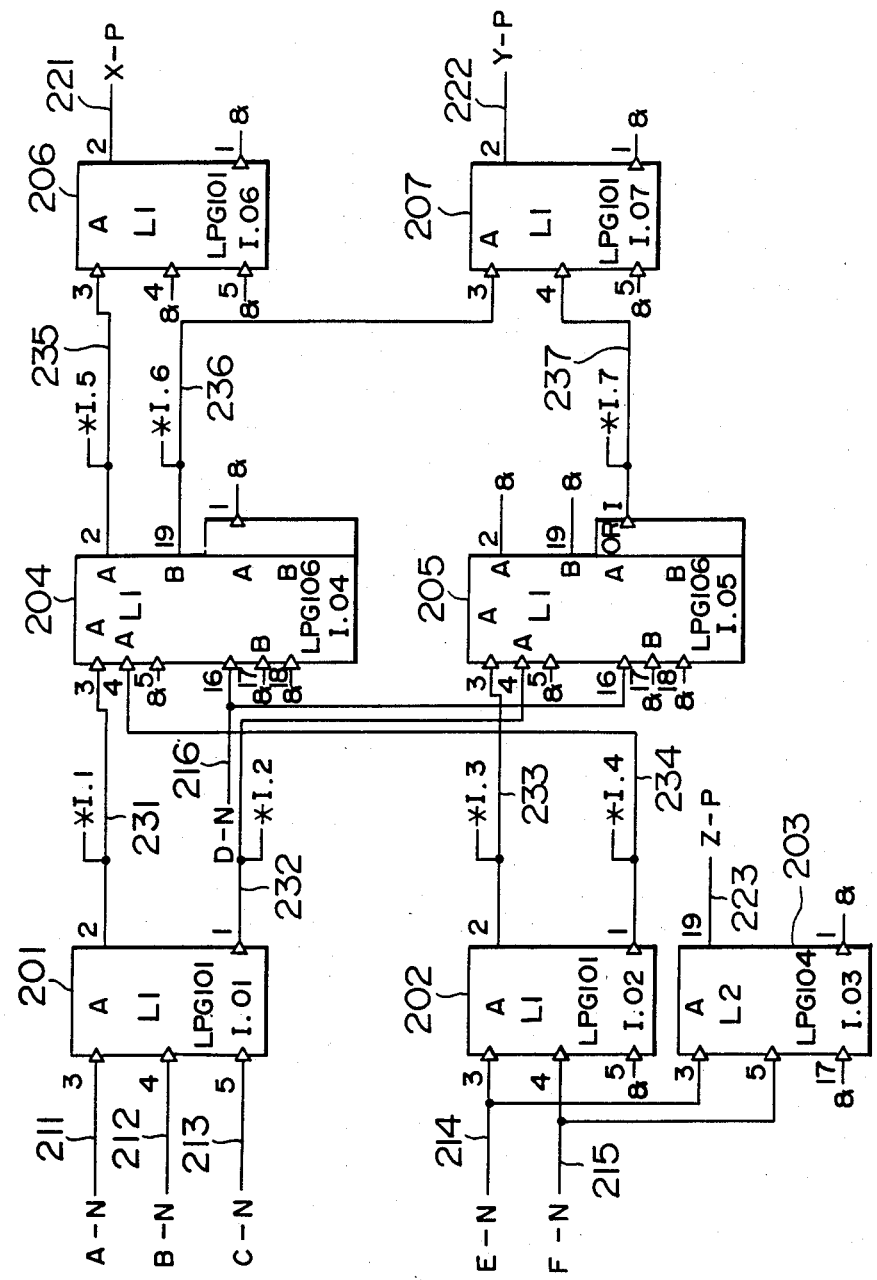
FIGS. 3 to 5 show gate-level logic diagrams.
Figure 4:
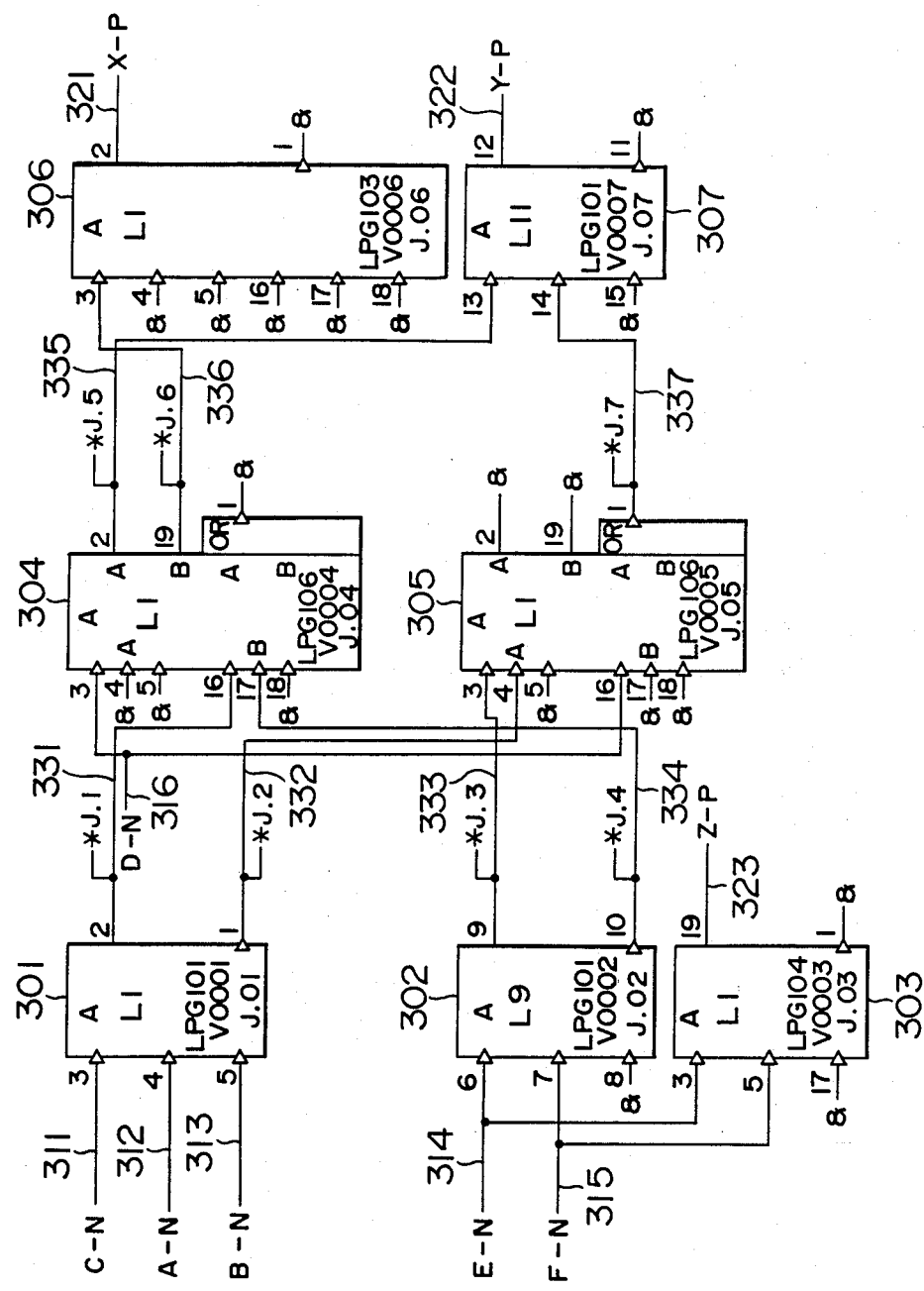

Differences between the contents of the gate-level logic file 111 generated by the automatic logic synthesis system 101 and the gate-level logic file 113 with the physical design information and the manually optimized logic design information prepared by the layout system 102 and the gate-level logic capture system 103 will be explained. FIG. 3 shows an example of gate-level logic in the gate-level logic file 111, and FIG. 4 shows the gate-level logic in the gate-level logic file 113 corresponding to the gate-level logic in the file 111. Differences between the gate-level logics of FIGS. 3 and 4 are as follows:

(1) Gate replacement

In gate array design, it is usual that there are several gates in one cell, gates of the same gate type exist in two or more cells, or two or more such gates exist in one cell. Since the automatic logic synthesis system 101 synthesizes gate-level logic using a set of representative gates, representative gates are replaced with other equivalent gates by the layout system 102. A gate 201 shown in FIG. 3 is the representative of 3-input AND gates and its gate type is represented by the pair of cell type LPG 101 and logic symbol name L1. In FIGS. 3 and 4, LPG 101/L1, LPG 101/L9 and LPG 101/L11 are of the same gate type and gates 202 and 207 are replaced with gates 302 and 307, respectively.

(2) Pin exchange

Since the automatic logic synthesis system 101 selects input/output pins in ascending order of their number when they are selectable in synthesizing gate-level logic, pins are exchanged within the pin exchangeability by the layout system 102. The pin exchangeability is as follows.

(a) For a simple gate such as the gate 201 in FIG. 3, input pins are exchangeable.

(b) A composite gate such as a gate 204 in FIG. 3 comprises several subgates. Specifically, the gate 204 comprises a 3-input AND subgate 204-A with input pins #3, 4 and 5 and an output pin #2, a 3-input AND subgate 204-B with input pins #16, 17 and 18 and an output pin #19, and a 2-input OR subgate with the outputs of those subgates as inputs thereto and an output pin #1. In such a composite gate, the subgates of the same subgate type are exchangeable, and the input pins of each subgate are also exchangeable.

In FIGS. 3 and 4, the gate 201 has its input pins which are exchanged like in the gate 301, and the gate 204 has its subgates which are exchanged like in the gate 304.

(3) Manual logic optimization

Since the number of cells that can be placed in one LSI is limited, the usable number of gates of a specific gate type is also limited. If gates of a specific gate type are not sufficient in number, other gates of replaceable gate types are used. Thus, various manual logic optimization can be done to optimize the overall design of LSI's. In FIGS. 3 and 4, the gate 206 is replaced with the gate 306 by manual logic optimization.

Figure 5:
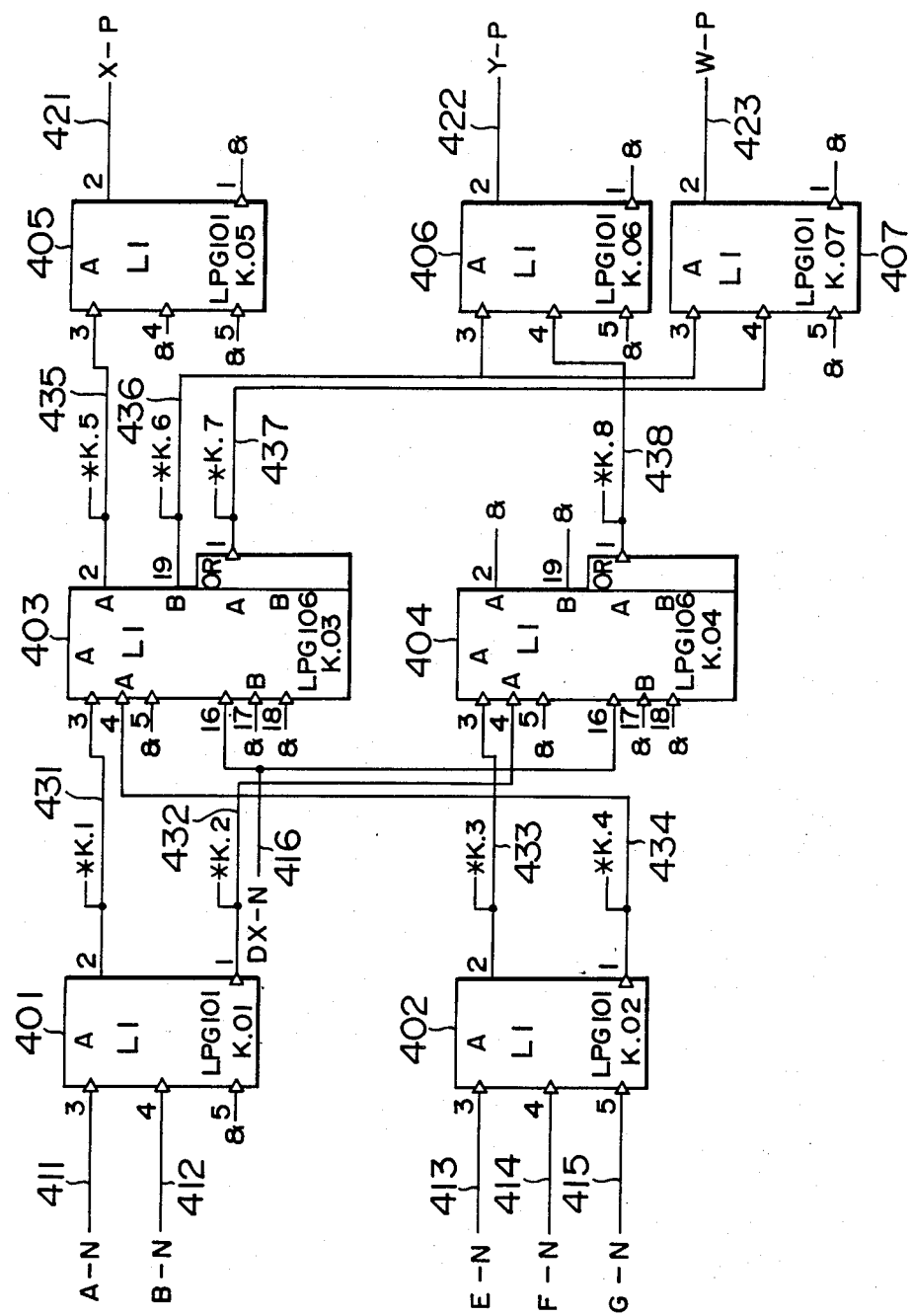

FIG. 5 shows gate-level logic obtained by modifying functional-level logic corresponding to the gate-level logic shown in FIG. 3 and synthesizing from the modified functional-level logic. The modifications in the gate-level logic are described below.

(1) A gate 203 and signal lines 214, 215 and 223 for the gate 203 have been removed, and a gate 407 and signal lines 436, 437 and 423 therefor have been added.

(2) A signal line 213 of the gate 201 has been removed, a signal line 216 of gates 204 and 205 has been changed into a signal line 416 of gates 403 and 404, and a signal line 415 of a gate 402 has been added.

Figure 1:
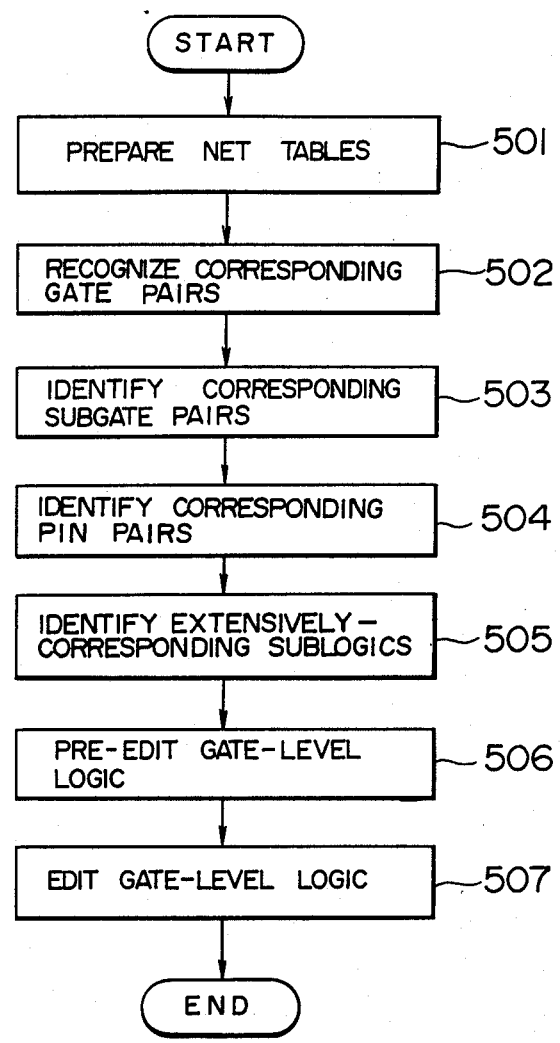
FIG. 1 shows a flow chart of incremental logic synthesis processing of the present invention.

The embodiment of the present invention will be explained now in detail with reference to the drawings. FIG. 1 is a flow chart showing overall incremental logic synthesis processing in accordance with the present invention. The incremental logic synthesis procedure is explained for the two gate-level logics shown in FIGS. 4 and 5 with reference to the processing flow shown in FIG. 1.

Step 501:

The gate-level logic is expressed in a fixed length record format called IC operation together with physical design information for each gate part. In this step, two net tables each of which comprises a gate table, an input/output pin table and an input/output connection table are prepared based on the IC operations of the current gate-level logic (content of the file 113) and the intermediate gate-level logic (content of the file 115) for use in the subsequent steps.

Step 502:

In this step, corresponding gate pairs are identified on the basis of the following four indices.

(1) Common primary input signal ratio: $R_{CIS}(G_I, G_J)$ $$R_{CIS}(G_I, G_J) = 50 \left[ \frac{N_{CIS}(G_I, G_J)}{N_{IS}(G_I)} + \frac{N_{CIS}(G_I, G_J)}{N_{IS}(G_J)} \right]$$

where $N_{IS}(G_I)$ and $N_{IS}(G_J)$ are numbers of primary input signals which determine the output logical values of the gate $G_I$ of the current gate-level logic and the gate G of the intermediate gate-level logic, respectively, and $N_{CIS}(G_I, G_J)$ is the number of common signals in the primary input signals of $G_I$ and $G_J$.

(2) Common primary output signal ratio: $R_{COS}(G_I, G_J)$ $$R_{COS}(G_I, G_J) = 50 \left[ \frac{N_{COS}(G_I, G_J)}{N_{OS}(G_I)} + \frac{N_{COS}(G_I, G_J)}{N_{OS}(G_J)} \right]$$

where $N_{OS}(G_I)$ and $N_{OS}(G_J)$ are numbers of primary output signals whose logical values are determined by the output logical values of the gates $G_I$ and $G_J$, respectively, and $N_{COS}(G_I, G_J)$ is the number of common signals in the primary output signals of $G_I$ and $G_J$.

(3) Common input gate ratio: $R_{CIG}(G_I, G_J)$ $$R_{CIG}(G_I, G_J) = 50 \left[ \frac{N_{CIG}(G_I, G_J)}{N_{IG}(G_I)} + \frac{N_{CIG}(G_I, G_J)}{N_{IG}(G_J)} \right]$$

where $N_{IG}(G_I)$ and $N_{IG}(G_J)$ are numbers of input gates or primary input signals which are directly connected to the input pins of $G_I$ and $G_J$, respectively, and $N_{CIG}(G_I, G_J)$ is a total of the number of gate pairs in the input gates of $G_I$ and $G_J$ which are identified as corresponding gate pairs and the number of common signals in the primary input signals.

(4) Common output gate ratio: $R_{COG}(G_I, G_J)$ $$R_{COG}(G_I, G_J) = 50 \left[ \frac{N_{COG}(G_I, G_J)}{N_{OG}(G_I)} + \frac{N_{COG}(G_I, G_J)}{N_{OG}(G_J)} \right]$$

where $N_{OG}(G_I)$ and $N_{OG}(G_J)$ are numbers of output gates or primary output signals which are directly connected to the output pins of $G_I$ and $G_J$, respectively, and $N_{COG}(G_I, G_J)$ is a total of the number of gate pairs in the output gates of $G_I$ and $G_J$ which are identified as corresponding gate pairs, and the number of common signals in the primary output signals.

Figure 6:
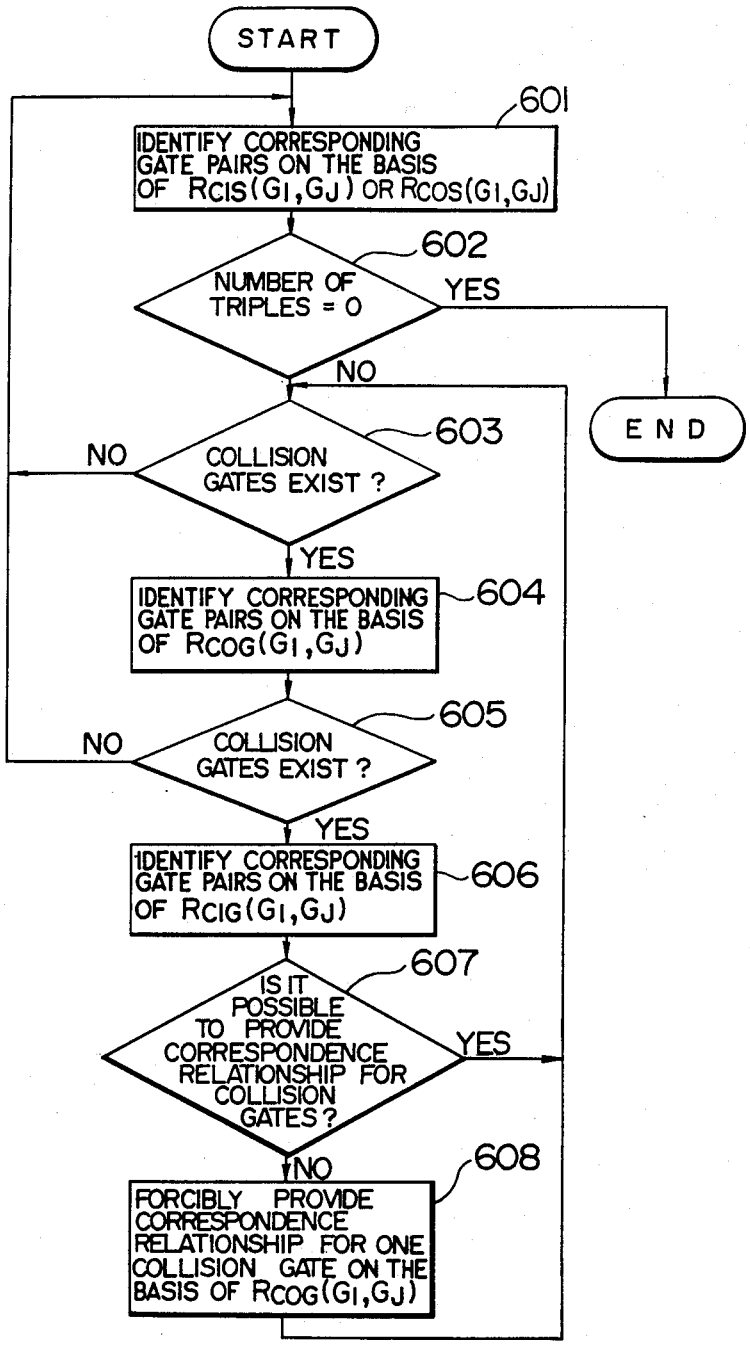
FIG. 6 shows a flow chart for identifying corresponding gate pairs.

The procedure in the step 502 somewhat varies with the dimensional relationship between the number of primary input signals and the number of primary output signals of the intermediate gate-level logic. FIG. 6 shows a procedure where the number of primary input signals is larger. The procedure of the step 502 is explained with reference to the processing flow of FIG. 6.

Steps 601 and 602: In those steps, corresponding gate pairs are identified on the basis of $R_{CIS}(G_I, G_J)$.

(1) A collision gate table is initialized.

(2) When each gate pair $(G_I, G_J)$ of $G_I(I=1, \ldots, N_I)$ and $G_J(J=1, \ldots, N_J)$ meets the following two conditions, a $R_{CIS}(G_I, G_J)$ is calculated, and if the $R_{CIS}(G_I, G_J) > 0$, the triple $(R_{CIS}(G_I, G_J), G_I, G_J)$ is generated and registered in a stack.

(a) $G_I$ and $G_J$ are of the same gate type.

(b) Neither $G_I$ nor $G_J$ is identified as a corresponding gate.

(3) If the number of triples in the stack is zero, the gate identification step 502 for corresponding gate pairs terminates.

(4) Otherwise, the triples in the stack are sorted in descending order for a first key and in ascending order for second and third keys, where the first key is $R_{CIS}(G_I, G_J)$, the second key is $G_I$ and the third key is $G_J$.

(5). The triples are processed as follows in the descending order of $R_{CIS}(G_I, G_J)$. Let us denote the triple under processing by $([R_{CIS}(G_I, G_J)]_c, [G_I]_c, [G_J]_c)$ and the subsequent triples by $([R_{CIS}(G_I, G_J)]_{c+1}, [G_I]_{c+1}, [G_J]_{c+1}), \ldots$.

(a) If either $[G_I]_c$ or $[G_J]_c$ is identified as a corresponding gate or collision gate, the subsequent sub-steps are skipped.

(b) If the following logic expression is met, $[G_I]c$ is made to correspond to $[G_J]_c$.

$$((([R_{CIS}(G_I, G_J)]_c = [R_{CIS}(G_I, G_J)]_{c+1}) \wedge (([G_I]_c = [G_I]_{c+1}) \vee [G_J]_{c+1}))) = 0$$

(c) If the above logic expression is not met, it implies that one or more gates in one gate-level logic apparently correspond to two or more gates in the other gate-level logic. This condition is called gate collision and the gates concerned are called collision gates. Specifically, all $G_I$'s of the triples which are $([R_{CIS}(G_I, G_J)]_c, G_I, [G_J]_c)$'s are collision gates of the current gate-level logic, and all $G_J$'s of the triples which are $([R_{CIS}(G_I, G_J)]_c, [G_I]_c, G_J)$'s are collision gates of the intermediate gate-level logic. A group of those collision gates is registered in the collision gate table relative to the group rank or the minimum of gate ranks starting from the primary output signals of the collision gates of the intermediate gate-level logic in the collision gate group.

Steps 603, 604: Those steps identify corresponding gate pairs on the basis of $R_{COG}(G_I, G_J)$.

(1) If the number of entries of the collision gate table is zero, this step terminates.

(2) Otherwise, the collision gate groups $GR_K(K=1, \ldots, N_k)$ are taken out in ascending order of the group rank, and the following processing is done for each $GR_K$.

(a) Collision gates in $GR_K$ which are identified as corresponding gates are eliminated.

(b) If the collision gate no longer exists, the subsequent sub-steps are skipped.

(c) If only one gate of the current gate-level logic and one gate of the intermediate gate-level logic leave in the collision gate group, both gates are made to correspond to each other and the subsequent substeps are skipped.

(d) In case other than (b) or (c), the following processing is carried out to the collision gates $CG_{KI}(I=1, \ldots, N_{KI})$ of the current gate-level logic and the collision gates $CG_{KJ}(J=1, \ldots, N_{KJ})$ of the intermediate gate-level logic.

(i) A group of the remaining collision gates are reregistered to the collision gate table.

(ii) A $R_{cog}(CG_{KI}, CG_{KJ})$ is calculated for each collision gate pair $CG_{KI}, CG_{KH}$) to prepare the triple $(R_{COG}(CG_{KJ}, CG_{KJ}), CG_{KI}, CG_{KJ})$, which is then placed in the stack.

(iii) The triples in the stack are sorted in descending order for a first key and in ascending order for second and third keys, where the first key is $R_{COG}(CG_{KI}, CG_{KJ})$, the second key is $CG_{KI}$ and the third key is $CG_{KJ}$.

(iv) The triples are processed in the descending order of $R_{COG}(CG_{KI}, CG_{KJ})$ Let us denote the triple under processing by $([R_{COG}(CG_{KI}, CG_{KJ})]_c, [CG_{KI}]_c, [CG_{KJ}]_c)$ and the subsequent triples by $([R_{COG}(CG_{KI}, CG_{KJ})]_{c+1}, [CG_{KI}]_{c+1}), \ldots$ $[CG_{KI}]_c$ is made to correspond to $[CG_{KJ}]_c$ so long as the following logic expression is met. If the logic expression is not met, the gate matching processing is terminated.

$$((([R_{COG}(CG_{KI}, CG_{KJ})]_c = [R_{COG}(CG_{KI}, CG_{KJ})]_{c+1}$$
$$\wedge (([CG_{KI}]_c = [CG_{KI}]_{c+1}) \vee ([CG_{KJ}]_c =$$
$$[CG_{KJ}]_{c+1}))) = 0$$

Steps 605 and 606: In those steps, corresponding gate pairs are identified on the basis of $R_{CIG}(G_I, G_J)$. Those steps are essentially identical to the steps 603 and 604 except that $R_{COG}(G_I, G_J)$ is replaced with $R_{CIG}(G_I, G_J)$ and the collision gate groups are taken out in the descending order of the group rank.

Steps 607 and 608: If at least one corresponding gate pair can be identified through the steps 603 to 606, the present steps are repeated. Otherwise, one collision gate pair is forcibly made to correspond to each other on the basis of $R_{COG}(G_I, G_J)$ in the following manner.

(1) The collision gate group $GP_K$ with the minimum group rank is taken out.

(2) The collision gates $CG_{KI}(I=1, \ldots, N_{KI})$ of the current gate-level logic and the collision gate $CG_{KJ}(J=1, \ldots, N_{KJ})$ of the intermediate gate-level logic are processed in the following manner.

(a) The collision gate group is reregistered in the collision gate table.

(b) A $R_{COG} CG_{KI}, CG_{KJ}$) is calculated for each collision gate pair $CG_{KI}, CG_{KJ}$) to prepare the triple $(R_{COG}(CG_{KJ}, CG_{KJ}), CG_{KI}, CG_{KJ})$, which is placed in the stack.

(c) The triples in the stack are sorted in descending order for a first key, and in ascending order for second and third keys, where the first key is $R_{COG} CG_{KI}, CG_{KJ}$), the second key is $CG_{KI}$ and the third key is $CG_{KJ}$.

(d) $CG_{KI}$ and $CG_{KJ}$ of the leading triple with the maximum $R_{COG}$ ($CG_{KI}$, $CG_{KJ}$) are made to forcibly correspond to each other.

Figure 19:
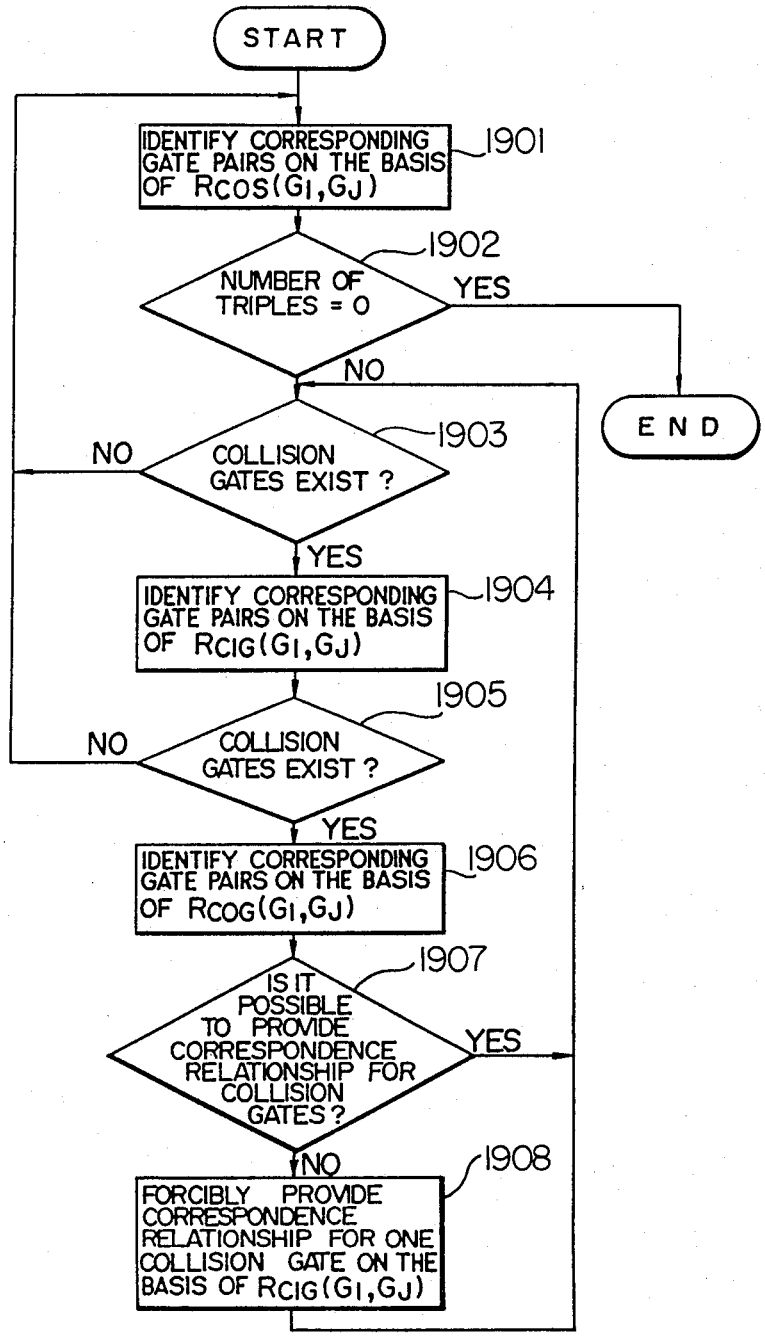
FIG. 19 shows a flow chart for identifying corresponding gate pairs.

Also, FIG. 19 shows a procedure where the number of primary output signals is larger than the number of primary input signals. FIG. 19 is somewhat different from FIg. 6. Differences between the figures are that $R_{CIS}$ ($G_I$, $G_J$) in the step 601 is replaced with $R_{COS}$ ($G_I$, $G_J$) in step 1901, $R_{COG}$ ($G_I$, $G_J$) in the steps 604 and 608 are replaced with $R_{CIG}$ ($G_I$, $G_J$) in steps 1904 and 1908, the collision gate group with the, maximum group in step 1908 instead of the minimum group rank in the step 608 is taken out at the beginning of the forcible gate matching step of the collision gate step 1908, and $R_{CIG}$ ($G_I$, $G_J$) is replaced with $R_{COG}$ ($G_I$, $G_J$) in the step 1906.

The procedures are specifically explained for the two gate-level logics of FIGS. 4 and 5. The gates 01, 302, ..., 307 in FIG. 4 are denoted by $G_I$, and the gates 401, 402, ..., 407 in FIG. 5 are denoted by $G_J$. In FIG. 5, since the number (6) of primary input signals is larger than the number (3) of primary output signals, corresponding gate pairs are identified on the basis of $R_{CIS}$ ($G_I$, $G_J$) First, calculation for $R_{CIS}$ ($G_I$, $G_J$)'s is explained. For example, if $G_I=$ and 304 and $G_J=$404, then $N_{IS}$ (304)=6, (D-N, C-N, A-N, B-N, E-N, F-N), $N_{IS}$ (404)=6 (A-N, B-N, DX-N, E-N, F-N, G-N), and $N_{CIS}$ 304, 404)=4 (A-N, B-N, E-N, F-N). As a result, $$R_{CIS} (304, 404) = 50 \times \left(\frac{4}{6} + \frac{4}{6}\right) = 67$$

The results of $R_{CIS}$ ($G_I$, $G_J$)'s of the gate pairs thus calculated are shown in FIG. 7. The triples $R_{CIS}$ ($G_I$, $G_J$), $G_I$, $G_J$)'s are generated for the gate pairs and sorted as shown in FIG. 8. The triples are processed as follows.

(1) Triple 1: The gate 301 and the gate 401 are made to correspond to each other.

(2) Triple 2: The gate 302 and the gate 402 are made to correspond to each other.

(3) Triples 3 – 5: Since the gate 302 is identified as a corresponding gate, they are skipped.

(4) Triples 6 – 9: Since the gates 304, 305, 403 and 404 are collision gates, they are registered in the collision gate table. The group rank of the collision gate group is 2.

(5) Triple 10: Since the gate 401 is identified as a corresponding gate in the step (1), it is skipped.

(6) Triples 11 – 13: Since the gates 307, 405, 406 and 407 are collision gates, they are registered in the collision gate table. The group rank of the collision gate group is 1.

(7) Triples 14 – 17: Since the gate 301 is identified as a corresponding gate and the gate 307 is identified as a collision gate, they are skipped.

Figure 9:
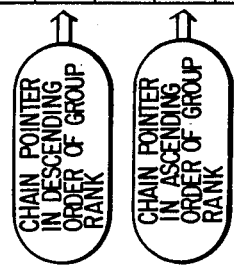

FIG. 9 shows the content of the collision gate table after the triple processing.

Then, corresponding gate pairs are identified on the basis of $R_{COG}$ ($G_I$, $G_J$). The collision gate groups are taken out in the ascending order of the group rank. The gates in the first collision gate group comprises gates 307, 405, 406 and 407. Calculation for $R_{COG}$, ($CG_{KI}$, $CG_{KJ}$)'s is first explained. Supposing that $CG_{KI}=$307 and $CG_{KJ}=$406, then $N_{CG}$ (307)=1 (Y-P), $N_{OG}$ (406)=1 (Y-P) and $N_{COG}$ (307, 406)=1 (Y-P). As a result, $$R_{COG} (307, 406) = 50 \left(\frac{1}{1} + \frac{1}{1}\right) = 100$$

FIG. 10 shows the calculation results of $R_{COG}(CG_{KJ})$'s for the collision gate pairs, and FIG. 11 shows the sorted result of the triples ($R_{COG}$ $CG_{KI}$, $CG_{KJ}$), $CG_{KI}$, $CG_{KJ}$)'s generated for the collision gate pairs. The triples are processed as follows.

(1) Triple 1: The gate 307 and the gate 406 are made to correspond to each other.

(2) Triples 2 and 3: Since the gate 307 is identified as a corresponding gate, they are skipped.

The gates in the second collision gate group comprise gates 304, 305, 403 and 404. FIG. 12 shows the calculated results of $R_{COG}$ ($CG_{KI}$, $CG_{KJ}$)'s for the collision gate pairs, and FIG. 13 shows the sorted result of the triples. The triples are processed as follows.

(1) Triple 1: The gate 305 and the gate 404 are made to correspond to each other.

(2) Triples 2 and 3: Since the gates 404 and 305 are identified as corresponding gates, they are skipped.

(3) Triple 4: The gates 304 and the gate 403 are made to correspond to each other.

In the above step, all corresponding gates have been identified and the step 502 is terminated.

Figure 14:
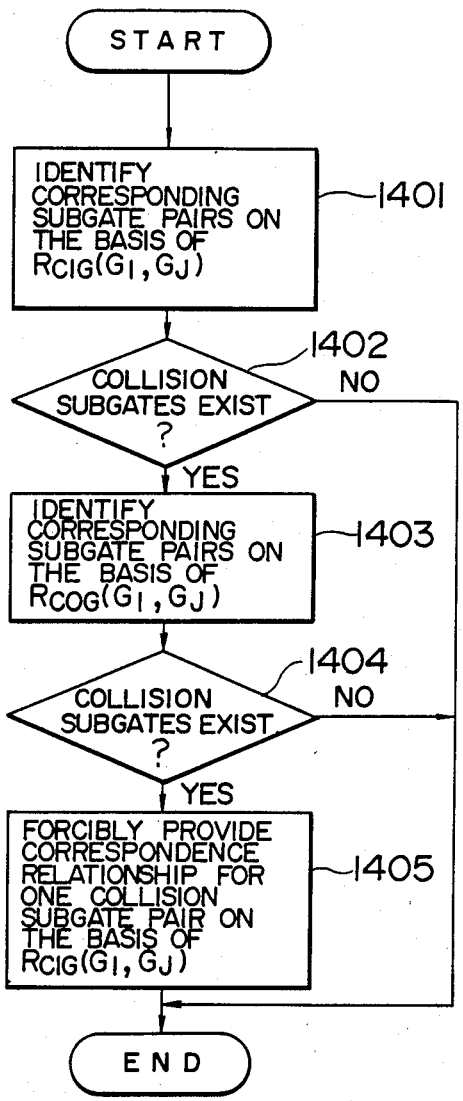
FIG. 14 shows a flow chart for identifying corresponding sub-gate pairs.

Step 503: In this step, corresponding subgate pairs are identified for each composite gate pair identified as a corresponding gate pair. The procedure in this step is explained in accordance with the processing flow shown in FIG. 14.

Step 1401: In this step, corresponding sub-gate pairs are identified on the basis of $R_{CIG}$ ($G_I$, $G_J$).

(1) For sub-gate pairs ($SG_I$, $SG_J$)'s of sub-gates $SG_I$ ($I=1, \ldots, N_{SI}$) of the current gate-level logic and $SG_J$ ($J=1, \ldots, N_{SJ}; N_{SI}=N_{SJ}$) of the intermediate gate-level logic, $R_{CIG}$ ($SG_I$, $SG_J$)'s are calculated to generate the triples ($R_{CIG}$ ($SG_I$, $SG_J$), $SG_I$, $SG_J$)'s, which are placed in the stack.

(2) The triples in the stack are sorted in descending order for a first key and in ascending order for second and third keys where the first key is $R_{CIG}$ ($SG_I$, $SG_J$), the second key is $SG_I$ and the third key is $SG_J$.

(3) The triples are processed in the following manner in the descending order of $R_{CIG}$ ($SG_I$, $SG_J$). Let us denote the triple under processing by ($[R_{CIG}$ ($SG_I$, $SG_J$)$]_c$, $[SG_I]_c$, $[SG_J]_c$), and the subsequent triples by ($[R_{CIG}$ ($SG_I$, $SG_J$)$]_{c+1}$, $[SG_I]_{c+1}$, $[SG_J]_{c+1}$), ....

(a) If either $[SG_I]_c$ or $[SG_J]_c$ is identified as a corresponding sub-gate, the subsequent sub-steps are skipped.

(b) If the following logic expression is met, $[SG_I]_c$ and $[SG_J]_c$ are made to correspond to each other.

$(([R_{CIG} (SG_I, SG_J)]_c = [R_{CIG} (SG_I, SG_J)]_{c+1})$
$\wedge(([SG_I]_c = [SG_I]_{c+1}) \vee ([SG_J]_{c=1})))+0$ (c) If the above logic expression is not met, a group of the collision sub-gates is taken out.

Steps 1402, 1403: If there is no collision sub-gate, the subgate identification step 503 for corresponding sub-gates is terminated. Otherwise, corresponding sub-gates are identified on the basis of $R_{COG}$ ($G_I$, $G_J$).

(1) For collision sub-gate pairs ($CSG_I$, $CSG_J$)'s of the collision sub-gates $CSG_I(I=1, \ldots, N_{CSI})$ of the current gate-level logic and the collision sub-gates $CSG_J$ ($J=1$, ..., $N_{CSJ}$) of the intermediate gate-level logic, $R_{COG}$ ($CSG_I$, $CSG_J$)'s are calculated to generate the triples ($R_{COG}$ ($CSG_I$, $CSG_J$), $CSG_I$, $CSG_J$)'s, which are placed in the stack.

(2) The triples in the stack are sorted in descending order for a first key, and in ascending order for second and third keys, where the first key is $R_{COG}$ ($CSG_I$, $CSG_J$), the second key is $CSG_I$ and the third key is $CSG_J$.

(3) The triples are processed in the following manner in the descending order of $R_{COG}$($CSG_I$, $CSG_J$). Let us denote the triple under processing by ($[R_{COG}$ ($CSG_I$, $CSG_J$)$]_c$, $[CSG_I]_c$, $[CSG_J]_c$), and the subsequent triples by ($[R_{COG}$ ($CSG_I$, $CSG_J$)$]_{c+1}$, $[CSG_I]_{c+1}$, $[CSG_J]_{c+1}$), ....

(a) If either $[CSG_I]_c$ or $[CSG_J]_c$ is identified as a corresponding sub-gate, the subsequent sub-steps are skipped.

(b) If the following logic expression is met, $[CSG_I]c$ and $[CSG_J]c$ are made to correspond to each other.

$$(([R_{COG}(CSG_I, CSG_J)]_c = (CSG_I, CSG_J)]_{c+1}) \wedge (([CSG_I]_c = [CSG_I]_{c+1}) \vee ([CSG_J]_c = [CSG_J]_{c+1}))) = 0$$

(c) If the above logic expression is not met, a group of the collision sub-gates is taken out.

Steps 1404, 1405: If there is no collision sub-gate, the sub-gate identification step 503 for corresponding sub-gates is terminated. Otherwise, one collision sub-gate pair is forcibly corresponded on the basis of $R_{CIG}$ ($G_I$, $G_J$) in the following manner.

(1) For the collision sub-gate pairs ($CSG_I$, $CSG_J$)'s of the collision sub-gates $CSG_I$ (I=1, ..., $N_{CSI}$) of the current gate level logic and the collision sub-gates $CSG_J$ (J=1, ..., $N_{CSJ}$) of the intermediate gate-level logic, $R_{CIG}$ ($CSG_I$, $CSG_J$)'s are calculated to generate the triples ($R_{CIG}$ ($CSG_I$, $CSG_J$), $CSG_I$, $CSG_J$)'s, which are placed in the stack.

(2) The triples in the stack are sorted in descending order for a first key and in ascending order for second and third keys, where the first key is $R_{CIG}$ ($CSG_I$, $CSG_J$), the second key is CSG and the third key is $CSG_J$.

(3) $CSG_I$ and $CSG_J$ are made to forcibly correspond to each other in the descending order of $R_{CIG}$ ($CSG_I$, $CSG_J$) of the triple.

The above procedure is now specifically explained for the two gate-level logics shown in FIGS. 4 and 5, in which the gate pairs of the gates 304 and 403 and the gates 305 and 404 are corresponding composite gate pairs to be processed. FIG. 15 shows the calculation results of $R_{CIG}$($SG_I$, $SG_J$)'s of the sub-gate pairs of the gates 304 and 403, and FIG. 16 shows the sorted result of the triples ($F_{CIG}$ ($SG_I$, $SG_J$), $SG_I$, $SG_J$)'s generated for the sub-gate pairs. The triples are processed in the following manner.

(1) Triple 1: A sub-gate 304-B and a sub-gate 403-A are made to correspond to each other.

(2) Triple 2: Since the sub-gate 403-A is identified as a corresponding sub-gate, it is skipped.

(3) Triple 3: A sub-gate 304-A and a sub-gate 403-B are made to correspond to each other.

(4) Triple 4: Since the sub-gate 304-B is identified as a corresponding sub-gate, it is skipped.

For the sub-gate pairs of the gates 305 and 404, a sub-gate 305-A and a sub-gate 404-A are made to correspond to each other, and a sub-gate 305-B and a sub-gate 404-B are also made to correspond to each other.

Step 504: In this step, corresponding pin pairs are identified for each corresponding gate pair (or corresponding sub-gate pair if the corresponding gate is a composite gate). Corresponding pin pairs are identified by the following rules for each line pair.

(1) The source sides of the line pair are exchangeable pins of the corresponding gate pair (sub-gate pair), and the sink sides of the line pair are exchangeable pins of the other corresponding gate pair (sub-gate pair). For example, in the line pair of 333 and 433, the output pin pair of the pin #9 of the gate 302 and the pin #2 of the gate 402 is a corresponding pin pair, and the input pin pair of the pin #3 of the gate 305 and the pin #3 of the gate 402 is also a corresponding pin pair.

(2) The source sides of the line pair are exchangeable pins of the corresponding gate pair (sub-gate pair), and the sink sides of the line pair are of the same primary output line. For example, in the line pair of 322 and 422, the output pin pair of the pin #12 of the gate 307 and the pin #2 of the gate 406 is a corresponding pin pair.

(3) The source sides of the line pairs are of the same primary input line, and the sink sides of the line pairs are exchangeable pins of the corresponding gate pair (sub-gate pair). For example, in the line pair of 312 and 411, the input pin pair of the pin #4 of the gate 301 and the pin #3 of the gate 401 is a corresponding pin pair.

Step 505: In this step, the extensive correspondence relationship of the non-corresponding sublogics is examined if either of the following two conditions is met.

(1) An input pin pair is not identified as a corresponding input pin pair although the source sides of the line pair are exchangeable pins of the corresponding gate pair (sub-gate pair).

(2) A primary output line pair wherein the sink sides of the line pair are of the same primary output line but their source sides are not identified as a corresponding output pin pair.

Figure 17:
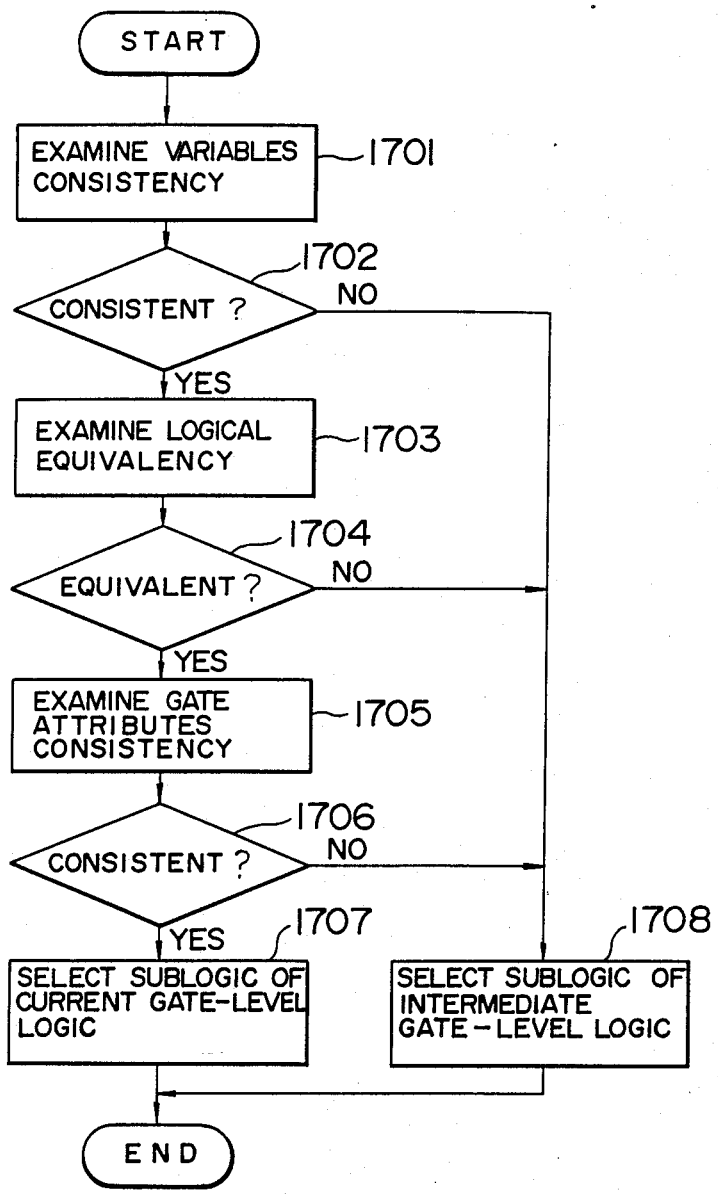
FIG. 17 shows a flow chart for identifying extensively-corresponding sublogics.

The procedures of this step is explained with reference to the processing flow shown in FIG. 17.

Step 1701: In this step, variables consistency is examined.

(1) The sublogic is traced toward the fan-in side from each input pin (primary output line) of the input pin pair (primary output line pair) to variables which meet any one of the following conditions.

(a) An output pin of a corresponding gate
(b) A primary input line (2) Two sets of variables obtained in this manner are related to one another, and common variable names Xl, X2, ... are assigned to variable pairs which meet any one of the following conditions.

(a) A pin-exchangeable output pin pair of a corresponding gate (sub-gate) pair
(b) A same primary input line Steps 1702, 1703: Logical equivalency is examined if all variables can be related.

(1) For each sublogic enclosed with the input pin (primary output line) which is the start point of the input trace and the common variables, a Boolean equation which represents the output logic function of the input pin (external output signal) using the common variables is produced.

(2) Logical equivalency of the Boolean equation pair is examined by a method equivalent to the article (1) or (2) cited above.

Steps 1704, 1705: If the Boolean equation pair is logically equivalent, gate attributes consistency is examined.

(1) The examination is done in two steps, one for the most output-side gate, and the other for all remaining gates, where the gate attributes representing physical characteristics such as gate power and gate speed are examined.

(2) Whether the most output-side gate pair is of the same gate attributes or not is examined.

(3) Whether all other gates of the current gate-level logic and the intermediate gate-level logic are of the same gate attribute or not is examined.

(4) If there is no gate to be compared in one gate-level logic in the sub-steps (2) or (3), gates in the other gate-level logic are supposed to be of the same gate attributes.

Steps 1706 - 1708: If the gate attributes are identical, the sublogic of the current gate-level logic is selected, and if one or more of the above three examinations are not satisfied, the sublogic of the intermediate gate-level logic is selected.

The above procedure is specifically explained with reference to the two gate-level logics shown in FIGS. 4 and 5. In FIGS. 4 and 5, the primary output line pair of the primary output lines X-P's is to be processed. In FIG. 4, when one sub-logic is traced toward the input side from X-P, the pin #19 of the gate 304 becomes a variable. In FIG. 5, when the other sublogic is traced toward the fan-in side from X-P, the pin #2 of the gate 403 becomes a variable. The gates 304 and 403 are a corresponding gate pair and the pin #19 and the pin #2 are exchangeable pins. Accordingly, this output pin pair becomes a common variable, which is denoted by Xl. When the Boolean equation pair of X-P's is generated using the variable, both of them become Xl's and hence the sublogics become logically equivalent. Finally, the gate attributes of the gates 306 and 405 are examined. Since they are identical, all of the three examinations have been satisfied. Thus, the sublogic of the current gate-level logic of FIG. 4 is selected.

Step 506: In this step, updated gate-level logic is pre-edited.

(1) Gate identification: Each gate has a gate identification to be assigned thereto. For example, K.01 indicated at the bottom of the gate 401 is a gate ID. In this step, a new gate ID is assigned to each selected gate of the intermediate gate-level logic so that it does not duplicate with the gate ID's of the selected gates of the current gate-level logic.

(2) Interconnecting signal name: Each interconnecting signal line between gates has an interconnecting signal name to be assigned thereto. In this step, a new interconnecting signal name is assigned for each selected interconnecting signal line of the intermediate gate-level logic so that it does not duplicate with the interconnecting signal names of the selected interconnecting signal lines of the current gate-level logic. In case fan-out signal lines are added to a corresponding output pin, the output signal name of the corresponding output pin of the current gate-level logic is assigned to the fan-out signal lines.

Figure 18:
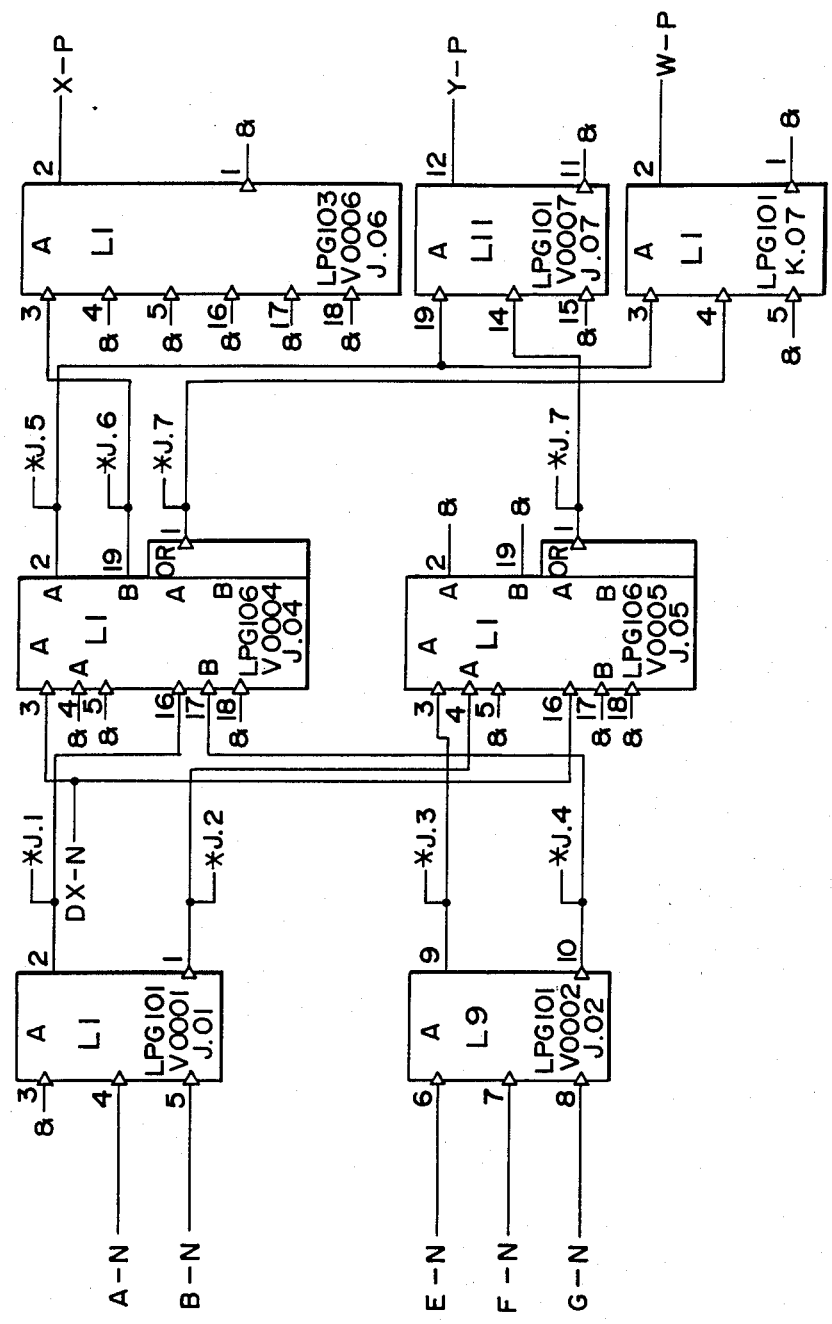
FIG. 18 shows a gate-level logic diagram.

Step 507: In this step, updated gate-level logic which is expressed in IC operations is generated based on the gate-level correspondence information, selection information and addition information in the net tables. FIG. 18 shows updated gate-level logic generated from the two gate-level logics shown in FIGS. 4 and 5. In FIG. 18, the results in the steps 506 and 507 are omitted in order to facilitate the understanding of the procedure.

In the present incremental logic synthesis method, the following is done in order to improve the preservation ratio of the physical design information and manually optimized logic design information.

(1) Discrimination of local parameter signals: The signals include three types, primary input/output signal, local parameter signal and interconnecting signal. For example, a local parameter signal is X corresponding to a local variable when functional-level logic is expressed in $$X = A \cdot B, \quad Y = X + C$$

Since the local parameter signal is a unique signal designated by a logic designer like the primary input/output signal, it is handled in the same manner as the primary input/output signal.

(2) Introduction of the equivalent signal group number: If a specific equivalent signal group number is assigned to the signal names before and after the modification of the primary input/output signal or the local parameter signal, the pair of the signals with those different signal names are regarded to be of the same signal.

In accordance with the present invention, when the gate-level logic is automatically modified in accordance with the modification of the functional-level logic in the physical design phase, the physical design information and manually optimized logic design information in the portions of the current gate-level logic which need not be modified are automatically preserved in the updated gate-level logic. Accordingly, the addition of the physical design information and the manual logic optimization need be done only for the modified portions. As a result, the design manpower required for the modification of logic design is reduced and hence the quality of logic design is improved.

We claim:

1. An incremental logic synthesis method executed by a computer, for synthesizing an up-dated gate-level logic circuit which performs up-dated functions of current functions which are performed by a current gate-level logic circuit so that part thereof is used in the up-dated circuit, wherein the current circuit may include a modification to an original gate-level logic circuit synthesized by a computer for performing the current functions, said method comprising the steps of:

(a) synthesizing an intermediate gate-level logic circuit which performs the up-dated functions, in response to input data describing the up-dated functions;

(b) synthesizing the up-dated circuit in response to data describing the synthesized intermediate circuit and to data describing the current circuit, wherein the synthesizing step includes the steps of (b1) identifying a corresponding-portion pair which includes a first portion within the current circuit and a second portion within the intermediate circuit, wherein the first and second portions are mutually equivalent, and (b2) combing the first portion within the current circuit with a portion other than the second portion, within the intermediate circuit, so as to obtain the up-dated circuit as a result of the combining.

2. An incremental logic synthesis method executed by a computer, for synthesizing an up-dated gate-level logic circuit having a plurality of gates, wherein the updated circuit performs up-dated functions of current functions performed by a current gate-level logic circuit having a plurality of gates such that a part of said current circuit is used in the up-dated circuit, and wherein the current circuit may include a modification to an original gate-level logic circuit synthesized by said computer for performing the current functions, said original circuit having a plurality of gates, said method comprising the steps of:

(a) synthesizing in response to input data describing the up-dated functions an intermediate gate-level logic circuit having a plurality of gates, wherein said intermediate circuit performs the up-dated functions; and (b) synthesizing the up-dated circuit in response to data describing the synthesized intermediate circuit and the current circuit;

wherein the step of synthesizing the up-dated circuit includes the steps of (b1) identifying a pair of corresponding-portions which comprises a first portion within the current circuit and a second portion within the intermediate circuit, wherein the first portion can perform identical logical operations on identical input signals and provide identical output signals, identical to the second portion, and (b2) combining the first portion within the current circuit with a portion other than the second portion, within the intermediate circuit, so as to obtain the up-dated circuit as a result of the combining.

3. A method according to claim 2, wherein the combining step includes a step of assigning to a respective gate and a respective interconnecting signal line included within the portion other than the second portion, within the intermediate circuit, a respective gate identification name and a respective signal line identification name which are not identical to gate identification names and signal line identification names assigned to gates and interconnecting signal lines included in the first portion within the current circuit.

4. A method according to claim 2, wherein the current circuit is a circuit obtained by modifying the original circuit so as to be adapted to operate within practical limits set by the physical characteristics of the gates.

5. A method according to claim 2, wherein the current circuit is a circuit obtained by replacing at least one of the gates included in the original circuit by another gate which can perform the same logical operation on an input signal thereto as the one gate.

6. A method according to claim 5, wherein the current circuit is a circuit obtained by mutually exchanging pins of one of the gates included in the original circuit so that a signal supplied to or from a pin of the one gate is supplied to or from a pin not corresponding to a pin of a corresponding gate of the current circuit.

7. A method according to claim 2, wherewith identifying step includes a step of identifying corresponding-gate pairs each comprising a first gate belonging to the first portion of the current circuit and a second gate belonging to the second portion of the intermediate circuit, wherein the first gate can perform one or a plurality of same logical operations on one or a plurality of same input signals and provides one or a plurality of same output signals, as the second gate.

8. A method according to claim 7, wherein the combining step includes a step of combining gates of the current circuit, belonging to the identified corresponding-gate pairs with gates of the intermediate circuit, not belonging to the identified corresponding-gate pairs.

9. A method according to claim 7, wherein the identifying step of corresponding-gate pairs includes a step of:

identifying as one of the corresponding-gate pairs, a respective gate pair comprising a first gate belonging to the current circuit and a second gate belonging to the intermediate circuit, when the gate pair satisfies a predetermined condition on an input gate which is a gate directly connected to an input pin of the first gate and on a gate connected to an input pin of the second gate.

10. A method according to claim 7, wherein the identifying step of the corresponding-gate pairs includes a step of:

identifying, as one of the corresponding-gate pairs, a respective gate pair comprising a first gate belonging to the current circuit and a second gate belonging to the intermediate circuit, when a first group of gates of the current circuit, comprising the first gate and one or plural other gates connected to the first gate and a second group of gates of the intermediate circuit, comprising the second gate and one or plural gates connected to the second gate satisfy a condition predetermined on logical operations performed by the first and second group and on kinds of physical characteristics of gates belonging to the first and second group.

11. A method according to claim 7, wherein the identifying step of the pair of corresponding-portions further includes a step of:

identifying corresponding-pin pairs for a respective one of the identified corresponding-gate pairs, wherein a respective corresponding-pin pair comprises first and second pins, wherein the first pin is included in a first gate of the current circuit, belonging to one of the identified corresponding-gate pairs and the second pin is included in a second gate of the intermediate circuit, belonging to the one corresponding-gate pair, wherein the first and second pins are pins for a same input or output signal.

12. A method according to claim 11, wherein the identifying step of the pair of corresponding-portions further includes a step of:

identifying corresponding-subgate pairs for a respective gate-pair belonging to the identified corresponding-gate pairs and comprising a first composite gate belonging to the current circuit and a second composite gate belonging to the intermediate circuit, wherein a respective corresponding-subgate pair comprises a first subgate belonging to the first composite gate and a second subgate belonging to the second composite gate, and wherein the first subgate can perform a same logical operation on one or a plurality of same input signals and provide one or a plurality of same output signals, as the second subgate.

13. A method according to claim 12, wherein the identifying step of corresponding-pin pairs includes a step of identifying corresponding-pin pairs for a respective corresponding-subgate pair.

14. A method according to claim 7, wherein the identifying step of corresponding-gate pairs includes a step of:

identifying as one of the corresponding-gate pairs, a respective gate pair comprising a first gate belonging to the current circuit and a second gate belonging to the intermediate circuit, when the gate pair satisfies a predetermined condition on a gate connected to an output pin of the first gate and on a gate connected to an output pin of the second gate.

15. A method according to claim 14, wherein the predetermined condition comprises a first condition on an output gate of the first gate and on an output gate of the second gate, wherein the output gate of the first gate is a gate directly connected to an output pin of the first gate and wherein the output gate of the second gate is a gate directly connected to an output pin of the second gate.

16. A method according to claim 15, wherein the first condition comprises a second condition on a common output corresponding-gate pair for the first and second gates, wherein the pair comprises an output gate of the first gate and on output gate of the second gate which have already been identified as belonging to one of the corresponding-gate pairs.

17. A method according to claim 16, wherein the second condition comprises a third condition on a total number of one or plural common output corresponding-gate pairs for the first and second gates.

18. A method according to claim 17, wherein the third condition comprises a fourth condition on a first sum($N_{OG}(G_I)$) of a total number of one or plural output gates of the first gate and a total number of one or plural primary output signals supplied from the first gate from outside of the current circuit, on a second sum ($N_{OG}(G_J)$) of a total number of one or plural output gates of the second gate and a total number of one or plural primary output signals supplied from the second gate to outside of the intermediate circuit, and on a third sum ($N_{COG}(G_I, G_J)$) of a total number of one or plural common output corresponding-gate pairs and a total number of one or plural common primary output signals supplied to the first gate and one or plural primary output signals supplied to the first gte and one or plural primary output signals supplied to the second gate.

19. A method according to claim 18, wherein the fourth condition comprises a fifth condition on a common output gate ratio which is dependent on a first ratio of the third sum ($N_{COG}(G_I, G_J)$) to the first sum ($N_{OG}(G_I)$) and on a second ratio of the third sum ($N_{COG}(G_I, G_J)$) to the second sum ($N_{CIG}(G_I)$).

20. A method according to claim 19, wherein the common output gate ratio is dependent on a sum of the first and second ratios.

21. A method according to claim 7, wherein the identifying step of the corresponding-gate pairs includes a step of:
identifying, as one of the corresponding-gate pairs, a respective gate pair comprising a first gate belonging to the current circuit and a second gate belonging to the intermediate circuit, when the gate-pair satisfies a predetermined condition on both an input signal supplied to the first gate and an input signal supplied to the second gate.

22. A method according to claim 21, wherein the predetermined condition comprises a first condition on both a primary input signal supplied to the first gate from outside of the current circuit and a primary input signal supplied to the second gate from outside of the intermediate circuit.

23. A method according to claim 22, wherein the first condition includes a second condition on a common primary input signal of the first and second gates which is a primary input signal belonging to both of one or a plurality of input signals supplied to the first gate and one or a plurality of primary input signals supplied to the second gate.

24. A method according to claim 23, wherein the second condition includes a third condition on a total number of one or a plurality of common primary input signal of the first and second gates.

25. A method according to claim 24, wherein the third condition comprises a fourth condition on a first total number ($N_{IS}(G_I)$) of one or a plurality of primary input signals supplied to the first gate, a second total number ($N_{IS}(G_J)$) of one or a plurality of primary input signals supplied to the second gate and a third total number ($N_{CIS}(G_I, G_J)$) of one or a plurality of common primary input signals of the first and second gates.

26. A method according to claim 25, wherein the fourth condition comprises a fifth condition on a common primary input signal ratio ($R_{CIS}(G_I, G_J)$) which is dependent on a first ratio of the third total number ($N_{CIS}(G_I, G_J)$) to the first total number ($N_{CIS}(G_I)$) and upon a second ratio of the third total number ($N_{CIS}(G_I, G_J)$) to the second total number ($N_{IS}(G_J)$).

27. A method according to claim 26, wherein the common primary input signal ratio ($R_{CIS}(G_I, G_J)$) is dependent on a sum of the first and second ratios.

28. A method according to claim 27, wherein the identifying step of a gate-pair as one of corresponding gate pairs based upon the fifth condition is carried out under a condition that a total number of primary input signals supplied to the intermediate circuit from outside thereof is larger than a total number of primary output signals supplied from the intermediate circuit to outside thereof.

29. A method according to claim 7, wherein the identifying step of the corresponding-gate pairs includes a step of:
identifying as one of the corresponding-gate pairs, a respective gate pair comprising a first gate belonging to the current circuit and a second gate belonging to the intermediate circuit, when the gate pair satisfies a predetermined condition on an output signal supplied from the first gate and on an output signal supplied from the second gate.

30. A method according to claim 29, wherein the predetermined condition comprises a first condition on both a primary output signal supplied from the first gate to outside of the current circuit and a primary output signal supplied from the second gate to outside of the intermediate circuit and does not include a condition on an interconnecting output signal supplied from the first gate to another gate of the current circuit nor a condition on an interconnecting output signal supplied from the second gate to another gate of the intermediate circuit.

31. A method according to claim 30, wherein the first condition includes a second condition on a common primary output signal of the first and second gates which is a primary output signal belonging to both of primary one or a plurality of output signals supplied from the first gate and one or a plurality of primary output signals supplied from the second gate.

32. A method according to claim 31, wherein the second condition includes a third condition on a total number of one or a plurality of common primary output signals of the first and second gates.

33. A method according to claim 32, wherein the third condition comprises a fourth condition on a first total number ($N_{OS}(G_I)$) of one or a plurality of primary output signals supplied from the first gate to outside of the current circuit, a second total number ($N_{OS}(G_J)$) of one or a plurality of primary output signals supplied from the second gate to outside of the intermediate circuit and a third total number of one or a plurality of common primary output signals of the first and second gates.

34. A method according to claim 33, wherein the fourth condition comprises a fifth condition on a common primary output signal ratio which is dependent upon a first ratio of the third total number to the first total number and upon a second ratio of the third total number to the second total number.

35. A method according to claim 34, wherein the common primary output signal ratio ($R_{COS}(G_I, G_J)$) is dependent on a sum of the first and second ratios.

36. A method according to claim 35, wherein the identifying step of a gate-pair as one of corresponding gate pairs based upon the fifth condition is carried out under a condition that a total number of primary input signals supplied to the intermediate circuit from outside thereof is less than a total number of primary output signals supplied from the intermediate circuit to outside thereof.

37. A method according to claim 36, wherein the predetermined condition comprises a first condition on an input gate of the first gate and on an input gate of the second gate, wherein the input gate of the first gate is a gate directly connected to an input pin of the first gate and wherein the input gate of the second gate is a gate directly connected to an input pin of the second gate.

38. A method according to claim 37, wherein the first condition comprises a second condition on a common input corresponding-gate pair for the first and second gates, wherein the pair comprises an input gate of the first gate and an input gate of the second gate which have already been identified as belonging to one of the corresponding-gate pairs.

39. A method according to claim 38, wherein the second condition comprises a third condition on a total number of one or plural common input corresponding-gate pairs for the first and second gates.

40. A method according to claim 39, wherein the third condition comprises a fourth condition on a first sum ($N_{IG}(G_I)$) of a total number of one or plural input gates of the first gate and a total number of one or plural primary input signals supplied to the first gate from outside of the current circuit, on a second sum (($N_{IG}(G_J)$)) of a total number of one or plural input gates of the second gate and a total number of one or plural primary input signals supplied to the second gate form outside of the intermediate circuit, and on a third sum ($N_{CIG}(G_I, G_J)$) of a total number of one or plural common input corresponding-gate pairs and a total number of one or plural common primary input signals of the first and second gates each of which is a primary input signal belonging to both of one or plural primary input signals supplied to the first gate and one or plural primary input signals supplied to the second gate.

41. A method according to claim 40, wherein the fourth condition comprises a fifth condition on a common input gate ratio which is dependent on a first ratio of the third sum ($N_{CIG}(G_I, G_J)$) to the first sum ($N_{IG}(G_I)$) and on a second ratio of the third sum ($N_{CIG}(G_I, G_J)$).

42. A method according to claim 41, wherein the common input gate ratio is dependent on a sum of the first and second ratios.

43. An incremental logic synthesis method executed by a computer, for synthesizing an up-dated gate-level logic circuit which performs up-dated functions of current functions which are performed by a current gate-level logic circuit so that part thereof is used in the up-dated circuit, wherein the current circuit may include a modification to an original gate-level logic circuit synthesized by a computer for performing the current functions, said method comprising the steps of:
(a) synthesizing an intermediate gate-level logic circuit which performs the up-dated functions, in response to input data describing the up-dated functions;
(b) synthesizing an up-dated circuit in response to data describing the synthesized intermediate circuit and to data describing the current circuit, wherein the synthesizing step includes a step of
(b1) identifying a corresponding-portion pair which includes a first portion within the current circuit and a second portion within the intermediate circuit, wherein the first portion can be used in place of the second portion, and
(b2) combining the first portion within the current circuit with a portion other than the second portion, within the intermediate circuit, so as to obtain the up-dated circuit as a result of the combining.

44. A method according to claim 43, wherein the identifying step includes a step of:
identifying corresponding-gate pairs each including a first gate which should belong to the first portion of the current circuit and a second gate which should belong to the second portion of the intermediate circuit, wherein the first gate can be used in place of the second gate.

45. A method according to claim 44, wherein the combining step includes a step of:
combining gates of the current circuit, belonging to the identified corresponding-gate pairs with gates of the intermediate circuit, not belonging to the identified corresponding-gate pairs.

46. A method according to claim 44, wherein the identifying step of the corresponding-portion pair further includes a step of:
identifying corresponding-subgate pairs for a respective gate-pair belonging to the identified corresponding-gate pairs and including a first composite gate belonging to the current circuit and a second composite gate belonging to the intermediate circuit,
wherein a respective corresponding-subgate pair comprises a first subgate belonging to the first composite gate and a second subgate belonging to the second composite gate, and
wherein the first subgate can be used in place of the second subgate.

47. A method according to claim 46, wherein the identifying step of the corresponding-portion pair further includes a step of: identifying corresponding-pin pairs for a respective one of already identified corresponding-gate pairs,
wherein a respective corresponding-pin pair comprises first and second pins, wherein the first pin is included in a first gate of the current circuit, belonging to one of the identified corresponding-gate pairs and the second pin is included in a second gate of the intermediate circuit, belonging to the one corresponding-gate pair, wherein the first and second pins which can be used in place of each other.

48. A method according to claim 44 wherein the identifying step of the corresponding gate pairs includes a step of:

identifying, as one of the corresponding-gate pairs a respective gate pair comprising a first gate belonging to the current circuit and a second gate belonging to the intermediate circuit, when the gate pair satisfies one of a first predetermined condition on a primary input signal supplied to the first gate from outside of the current circuit and a primary input signal supplied to the second gate from outside of the intermediate circuit and a second predetermined condition on a primary output signal supplied from the first gate to outside of the current circuit and a primary output signal supplied from the second gate to outside of the intermediate circuit.

49. A method according to claim 48, wherein the first and second conditions respectively comprises a condition on a common primary input signal ratio ($R_{CIS}(G_I, G_J)$) and a condition on a common primary output signal ratio ($R_{COS}(G_I, G_J)$) for the gate pair, wherein the common primary input signal ratio (($R_{CIS}(G_I, G_J)$) is dependent on a sum of a first ratio of a first total number ($N_{CIS}(G_I, G_J)$) to a second total number ($N_{IS}(G_I)$) and a second ratio of the first total number ($N_{CIS}(G_I, G_J)$) to a third total number ($N_{CIS}(G_J)$), and a number of one or plural common primary input signals of the first and second gates, wherein the first total number ($N_{CIS}(G_I, G_J)$) is total number of one or plural of common primary input signals of the first and second gates, wherein a respective common primary input signal of the first and second gates is a primary input signal belonging to both of one or plural primary input signals supplied to the first gate and one or plural primary input signals supplied to the second gate, wherein the second total number ($N_{IS}(G_I)$) is a total number of one or plural primary input signals supplied to the first gate from outside of the current circuit, wherein the third total number ($N_{IS}(G_J)$) is a total number of one or plural primary input signals supplied to the second gate from outside of the intermediate circuit, and wherein the common primary output signal ratio ($R_{COS}(G_I, G_J)$) is dependent upon a sum of a first ratio of a fourth total number ($N_{COS}(G_I, G_J)$) to a fifth total number ($N_{OS}(G_I)$) and a second ratio of the fourth total number ($N_{COS}(G_I, G_J)$) to a sixth total number ($N_{OS}(G_J)$), wherein the fourth total number ($N_{COS}(G_I, G_J)$) is a total number of one or plural common primary output signals of the first and second gates, wherein a respective common primary output signal of the first and second gates is a primary output signal belonging to both of one or plural primary output signals supplied from the first gate and one or plural primary output signals supplied from the second gate, wherein the fifth total number ($N_{OS}(G_I)$) is a total number of one or plural primary output signals supplied from the first gate to outside of the current circuit, and wherein the sixth total number ($N_{OS}(G_J)$) is a total number of one or plural primary output signals supplied from the second gate to outside of the intermediate circuit.

50. A method according to claim 49, wherein one of the first and second predetermined conditions is selected, depending upon whether or not a total number of primary input signals supplied to the intermediate circuit from outside thereof is larger than a total number of primary output signals supplied from the intermediate circuit to outside thereof.

51. A method according to claim 48, wherein the identifying step of corresponding-gate pairs further includes a step of:

identifying as one of the corresponding-gate pairs, a respective gate pair comprising a first gate belonging to the current circuit and a second gate belonging to the intermediate circuit, when the gate pair does not satisfy the one of the first and second conditions but satisfies a predetermined condition on one or plural gates directly connected to the first gate and on one or plural gates directly connected to the second gate.

52. A method according to claim 51, wherein the predetermined condition is one of third and fourth conditions, wherein the third condition is a condition on an output gate of the first gate and an output gate of a second gate, wherein the output gate of the first or second gate is a gate directly connected to an output pin of the first or second gate, wherein the fourth condition is a condition on an input gate of the first gate and an input gate of the second gate, wherein the input gate of the first or second gate is a gate directly connected to an input pin of the first or second gate.

53. A method according to claim 54, wherein one of the first and second predetermined conditions is selected, depending upon whether or not a total number of primary input signals supplied to the intermediate circuit from outside thereof is larger than a total number of primary output signals supplied from the intermediate circuit to outside thereof, wherein, when the second condition is selected, the identifying step of a corresponding-gate pair is first done based upon the fourth condition and thereafter the same step is further done based upon the third condition, for a gate pair not identified as a corresponding-gate pair in the identifying step which is based upon the fourth condition.

54. A method according to claim 52, wherein the third condition is a condition on a common output gate ratio which is dependent on a sum of a first ratio of a first sum ($N_{COG}(G_I, G_J)$) to a second sum ($N_{OG}(G_I)$) and on a second ratio of the first sum ($N_{COG}(G_I, G_J)$) to a third sum ($N_{OG}(G_J)$), wherein the first sum ($N_{COG}(G_I, G_J)$) is sum of a total number of one or plural common output corresponding-gate pairs and a total number of one or plural common primary output signals of the first and second gates each of which is a primary output signal belonging to both of one or plural primary output signals supplied to the first gate and one or plural primary output signals supplied to the second gate, wherein the second sum ($N_{OG}(G_I)$) is a sum of a total number of one or plural output gates of the first gate and a total number of one or plural primary output signals supplied from the first gate to outside of the current circuit, and wherein the third sum ($N_{OG}(G_J)$) is a sum of a total number of one or plural output gates of the second gate and a total number of one or plural primary output signals supplied from the second gate to outside of the intermediate circuit, wherein the fourth condition is a condition on a common input gate ratio which is dependent on a sum of a third ratio of a fourth sum ($N_{CIG}(G_I, G_J)$) to a fifth sum ($N_{IG}(G_I)$) and on a fourth ratio of the fourth sum ($N_{CIG}(G_I, G_J)$) to a sixth sum ($N_{IG}(G_J)$), wherein the fourth sum ($N_{CIG}(G_I, G_J)$) is a sum of a total number of one or plural common input corresponding-gate pairs and a total number of one or plural common primary input signals of the first and second gates each of which is a primary input signal belonging to both of one or plural primary input signals supplied to the first gate and one or plural primary input signals supplied to the second gate, wherein the fifth sum ($N_{IG}(G_I)$) is a sum of a total number of one or plural input gates of the first gate and a total number of one or plural primary input signals supplied to the first gate from outside of the current circuit, wherein the sixth sum ($N_{IG}(G_J)$) is a sum of a total number of one or plural input gates of the second gate and a total number of one or plural primary input signals supplied to the second gate from outside of the intermediate circuit.

55. A method according to claim 54, wherein one of the first and second predetermined conditions is selected, depending upon whether or not a total number of primary input signals supplied to the intermediate circuit from outside thereof is larger than a total number of primary output signals supplied from the intermediate circuit to outside thereof, wherein, when the first condition is selected, the identifying step of a corresponding-gate pair is first done based upon the third condition and thereafter the same step is further done based upon the fourth condition, for a gate pair not identified as a corresponding-gate pair in the identifying step which is based upon the third condition.

* * * * *